United States Patent
Schuele et al.

(10) Patent No.: US 7,265,393 B2
(45) Date of Patent: Sep. 4, 2007

(54) THIN-FILM TRANSISTOR WITH VERTICAL CHANNEL REGION

(75) Inventors: Paul J. Schuele, Washougal, WA (US); Apostolos T. Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 46 days.

(21) Appl. No.: 11/261,194

(22) Filed: Oct. 28, 2005

(65) Prior Publication Data
US 2006/0049461 A1   Mar. 9, 2006

Related U.S. Application Data

(62) Division of application No. 10/831,424, filed on Apr. 23, 2004, now Pat. No. 6,995,053.

(51) Int. Cl.
H01L 29/74 (2006.01)
(52) U.S. Cl. .................. 257/135; 257/302; 257/328; 257/347; 257/263
(58) Field of Classification Search .................. None
See application file for complete search history.

(56) References Cited

U.S. PATENT DOCUMENTS 4,757,361 A * 7/1988 Brodsky et al. ............. 257/57

2003/0075758 A1 * 4/2003 Sundaresan et al. ........ 257/329

FOREIGN PATENT DOCUMENTS

EP   0280370   *  8/1988

* cited by examiner

Primary Examiner—Evan Pert
Assistant Examiner—Tan Tran
(74) Attorney, Agent, or Firm—Law Office of Gerald Maliszewski; Gerald Maliszewski

(57) ABSTRACT

A vertical thin-film transistor (V-TFT) is provided along with a method for forming the V-TFT. The method comprises: providing a substrate made from a material such as Si, quartz, glass, or plastic; conformally depositing an insulating layer overlying the substrate; forming a gate, having sidewalls and a thickness, overlying a substrate insulation layer; forming a gate oxide layer overlying the gate sidewalls, and a gate insulation layer overlying the gate top surface; etching the exposed substrate insulation layer; forming a first source/drain region overlying the gate insulation layer; forming a second source/drain region overlying the substrate insulation layer, adjacent a first gate sidewall; and, forming a channel region overlying the first gate sidewall with a channel length about equal to the thickness of the gate, interposed between the first and second source/drain regions.

14 Claims, 7 Drawing Sheets

THIN-FILM TRANSISTOR WITH VERTICAL CHANNEL REGION

RELATED APPLICATIONS

This application is a Divisional of a pending patent application entitled, VERTICAL THIN FILM TRANSISTOR, invented by Schuele et al., Ser. No. 10/831,424, filed Apr. 23, 2004 now U.S. Pat. No. 6,995,053.

BACKGROUND OF THE INVENTION

1. Field of the Invention

This invention generally relates to integrated circuit (IC) fabrication and, more particularly, to a thin-film transistor (TFT) with a vertical channel region, and an associated fabrication process.

2. Description of the Related Art

The size of TFTs formed in liquid crystal display (LCD) processes are limited by the resolution of large panel photolithography tools. Currently, the resolution of feature sizes is about 0.5 microns (um) and larger. High-speed circuit operation requires a TFT capable of high drive current and low parasitic capacitance. These characteristics are obtained by shrinking the device size, especially the transistor channel length. For example, conventional production CMOS technology uses transistor channel lengths of 90 nanometers (nm), and lower, for very high-speed operation.

To further the enhancement of TFT drive currents and switching speeds, it would be desirable if the channel length of TFT devices could be made smaller than the resolution of photolithographic tools.

SUMMARY OF THE INVENTION

The present invention is a vertical TFT (V-TFT) transistor structure and process flow that can be used to make transistors with channel lengths of 0.2 um, and smaller, without the limitations associated with photolithography. This invention permits the integration of high-speed logic circuits on LCD display panels. This invention uses many conventional TFT processing methods to produce a V-TFT where the active channel length is controlled by the thickness of the gate layer deposition, rather than by patterning using photolithography and etching.

Accordingly, a method is provided for forming a V-TFT. The method comprises: providing a substrate made from a material such as Si, quartz, glass, or plastic; conformally depositing an insulating layer overlying the substrate; forming a gate, having sidewalls, a top surface, and a thickness, overlying a substrate insulation layer; forming a gate oxide overlying the gate sidewalls, and gate insulation layer overlying the gate top surface; etching the exposed substrate insulation layer; forming a first source/drain region overlying the gate insulation layer; forming a second source/drain region overlying the substrate insulation layer, adjacent a first gate sidewall; and, forming a channel region overlying the first gate sidewall with a channel length about equal to the thickness of the gate, interposed between the first and second source/drain regions.

In some aspects of the method, a lightly doped drain (LDD) is formed in the channel region adjacent the first source/drain region. In other aspects, the gate thickness is in the range of 1000 to 6000 Å. In a different aspect, a third source/drain region is formed overlying the substrate insulation layer, adjacent a second gate sidewall. Then, a channel region is formed overlying the second gate sidewall, interposed between the first source/drain region and the third source/drain region adjacent the second gate sidewall.

Additional details of the above-described method and a V-TFT device are presented below.

DETAILED DESCRIPTION OF THE PREFERRED EMBODIMENTS

Figure 1:
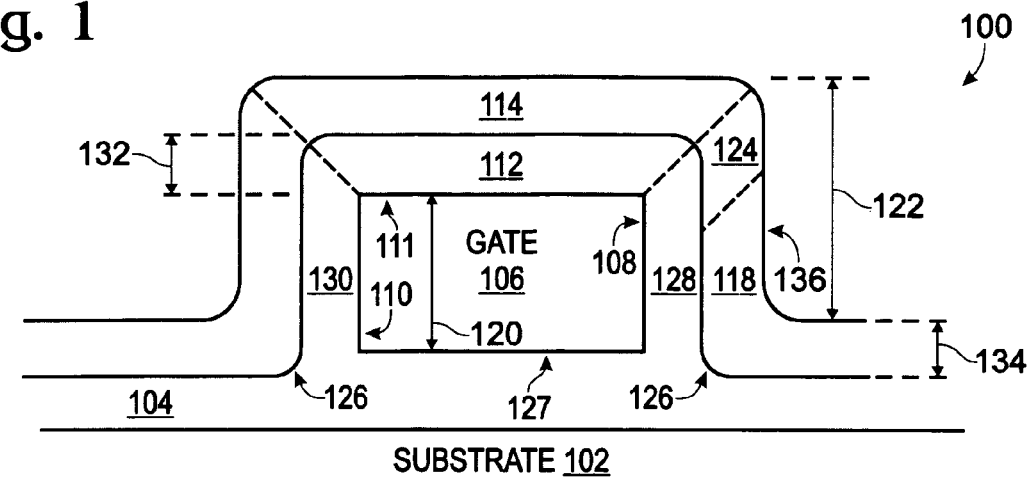
FIG. 1 is a partial cross-sectional view of the present invention vertical thin film transistor (V-TFT).

FIG. 1 is a partial cross-sectional view of the present invention vertical thin film transistor (V-TFT). The transistor 100 comprises a substrate 102 and a substrate insulation layer 104 overlying the substrate 102. A gate 106, having sidewalls 108 and 110, and a top surface 111, overlies the substrate insulation layer 104. A gate insulation layer 112 overlies the gate top surface 111. A first source/drain region 114 overlies the gate insulation layer 112. A second source/drain region 116 overlies the substrate insulation layer 104, adjacent a first gate sidewall 108. For example, the first source/drain region 114 may be a drain and the second source/drain region 116 may be a source. Alternately, the first source/drain region 114 may be a source and the second source/drain region 116 may be a drain. A channel region 118 overlies the first gate sidewall 108, interposed between the first and second source/drain regions 114/116.

The gate 106 has a first thickness 120, and the channel region 118 has a channel length 122 about equal to the first thickness 120. It should be understood that it is difficult to exactly define the start and end points of the channel length. Further, tolerance and process variation make it difficult to precisely define the relationship between channel length 122 and the gate thickness 120. Generally, however, the channel length 122 is slightly greater than the first thickness 120. In some aspects, the gate first thickness 120 is in the range of 1000 to 6000 Å. In other aspects, a lightly doped drain (LDD) 124 is formed in the channel region 118 adjacent the first source/drain region 114.

The substrate 102 can be a material such as Si, quartz, glass, or plastic, which is consistent with conventional CMOS and LCD processes. The substrate insulation layer 104 can be a material such as SiO2, SiO2/Si3N4/SiO2, or organic insulators such as polyimide.

In some aspects, the substrate insulation layer 104 includes a recess 126 formed in the substrate insulation layer adjacent the first gate sidewall 108. The recess 126 is defined with respect to the bottom surface 127 of the gate 106. The channel region 118 extends into the substrate insulation layer recess 126.

The gate 106 can be formed from any conventional CMOS material. For example, the gate 106 may be a metal material such as W or TiN. Alternately, the gate 106 is a doped Si material. If the gate is Si (as shown), oxidized Si gate sidewall insulators (gate oxide layers) 128/130, may be formed overlying sidewalls 108/110, respectively. In one aspect, the gate insulation layer 112 is a material such as SiO2 or Si3N4, having a thickness 132 in the range of 25 to 500 Å.

In another aspect, the first and second source/drain regions 114/116 are crystallized Si having a thickness 134 in the range of 300 to 1000 Å. For example, the first and second source/drain regions 114/116 may be crystallized with the aid of Ni impurities. Optionally, a Vt adjust implant 136 may be in the channel region interposed between the first and second source/drain regions 114/116, to adjust the transistor threshold.

Figure 2:
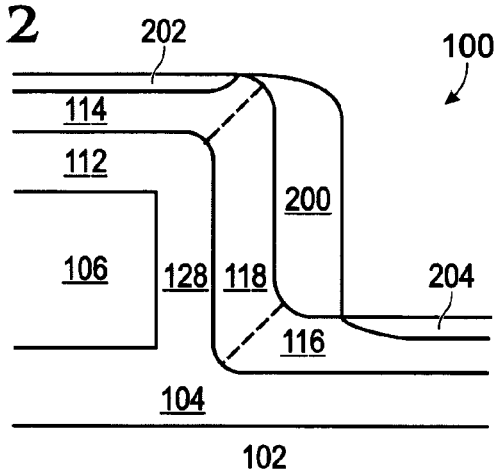
FIG. 2 is a partial cross-sectional view of a first variation of the V-TFT transistor of FIG. 1.

FIG. 2 is a partial cross-sectional view of a first variation of the V-TFT transistor of FIG. 1. An oxide spacer 200 overlies the channel region 118, interposed between the first and second source/drain regions 114/116. Further, silicide metal regions 202 and 204, including metal impurities such as Ni, Ti, or Co, are formed in the first and second source/drain regions 114/116, respectively.

Figure 3:
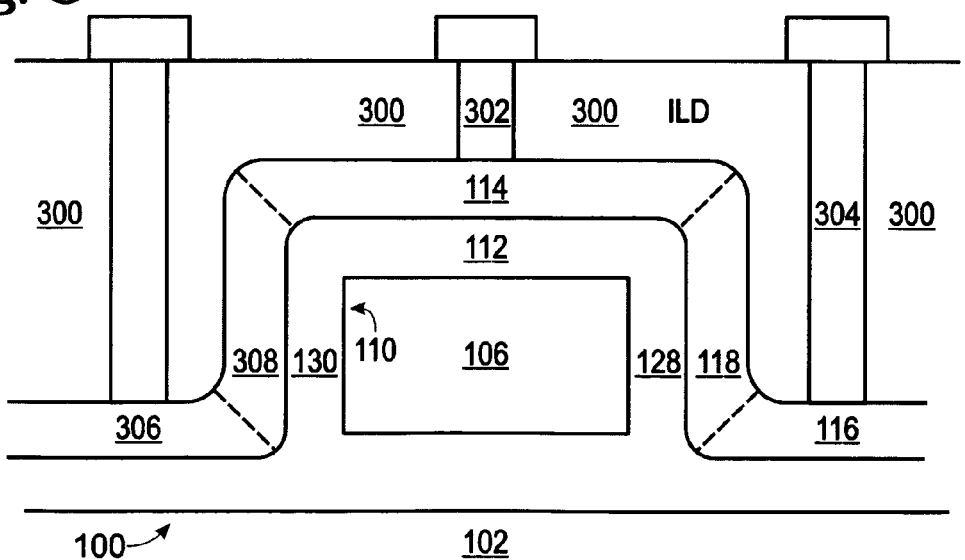
FIG. 3 is a partial cross-sectional view of a second variation of the V-TFT transistor of FIG. 1.

FIG. 3 is a partial cross-sectional view of a second variation of the V-TFT transistor of FIG. 1. An interlevel dielectric (ILD) 300, made from any conventional CMOS insulation material, overlies the transistor 100. Interconnects 302 and 304 are formed through the ILD 300 to the first source/drain region 114 and the second source/drain region 116. Note, the interconnect to the gate 106 cannot be seen in this view. Also shown is a third source/drain region 306 overlying the substrate insulation layer 104, adjacent a second gate sidewall 110. A channel region 308 overlies the second gate sidewall 110, interposed between the first source/drain region 114 and the third source/drain region 306 adjacent the second gate sidewall 110. For example, if the first source/drain region 114 is a drain, then the second and third source/drain regions 116/306 may be sources.

Functional Description

Figure 4:
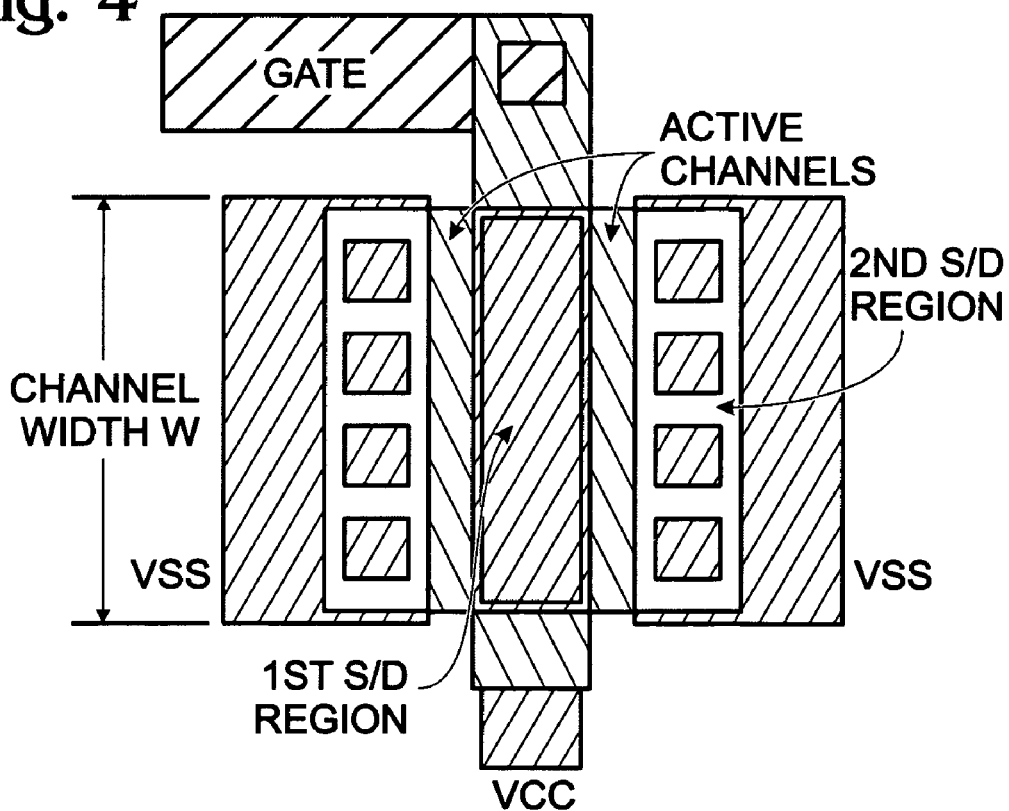
FIG. 4 is a top down, plan view of the V-TFT transistor of FIG. 3, illustrating connections and gate width.

FIG. 4 is a top down, plan view of the V-TFT transistor of FIG. 3, illustrating connections and gate width.

Figure 5:
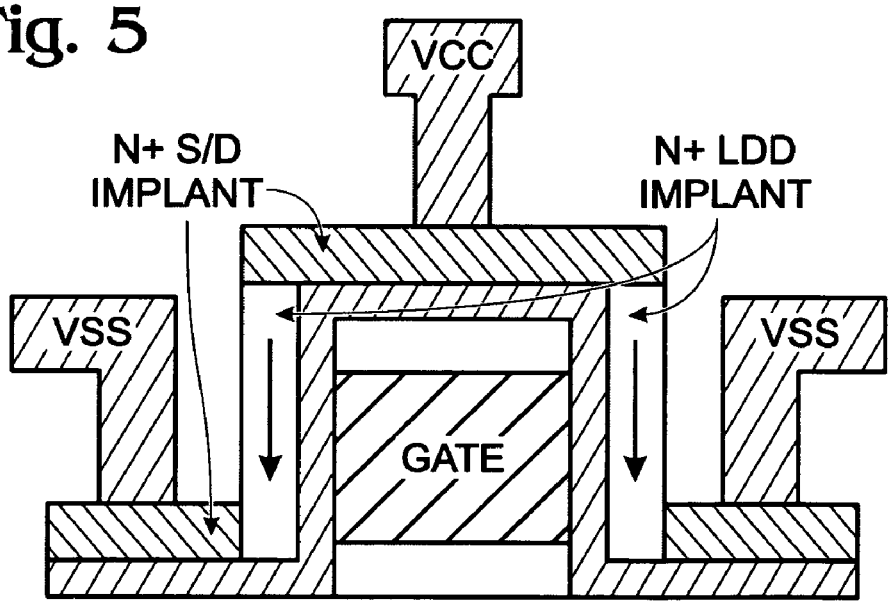
FIG. 5 is a partial cross-sectional view of the V-TFT transistor of FIG. 3, configured as an N channel device.

FIG. 5 is a partial cross-sectional view of the V-TFT transistor of FIG. 3, configured as an N channel device. The figure illustrates the general arrangement of features, terminals, and current flow. The transistor active channels are indicated by bold vertical arrows, showing that the channel length is determined by the thickness of the gate. With a positive voltage applied to the gate, current flows from Vcc to Vss through the depletion regions indicated by vertical arrows. Because the process flow only results in a LDD implant at the "top" of the channel, the high voltage (Vcc) terminal may be connected the first source/drain region over the gate, as shown.

An exemplary V-TFT process flow is as follows:
Use a substrate, which may be silicon, quartz, or glass.
Deposit a PECVD insulating layer to isolate the V-TFT from the substrate. The isolation layer may be ~3000 Å of SiO2, or a stack with ~2500 Å SiO2/~100 Å Si3N4/~300 Å to 1500 Å SiO2.
Deposit a gate stack consisting of two layers:
Polysilicon, 1000 Å to 6000 Å. The thickness determines the channel length; and,
PECVD silicon oxide ~300 to 1500 Å thick.
Dope the polysilicon gate using a photo mask and ion implantation. For N channel devices, implant phosphorus at about 3e15/40 keV. For P channel devices, implant boron at about 5e15/15 keV
Anneal the stack at about 600-700 degrees C., for 1 to 10 hours, to activate the dopants and densify the oxide layers.
Pattern the gate stack using photolithography and plasma etch. If a SiO2 substrate isolation (insulation) layer is used, the amount of overetch into the oxide layer, after the poly etch is complete, must be controlled to produce the desired gate/drain overlap (see recess 126 in FIG. 1). The more complex multi-layer substrate isolation stack permits the gate etch to stop on the nitride layer, producing a controlled gate/drain overlap set by the thickness of the SiO2 layer.

Figure 6A:
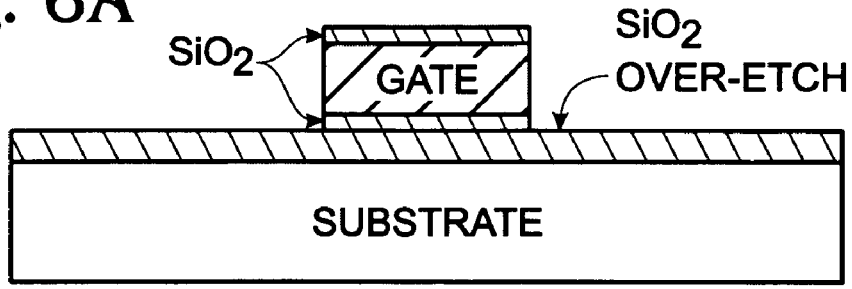
FIGS. 6A and 6B illustrate the process flows for two alternate substrate insulation layer processes.
Figure 6B:
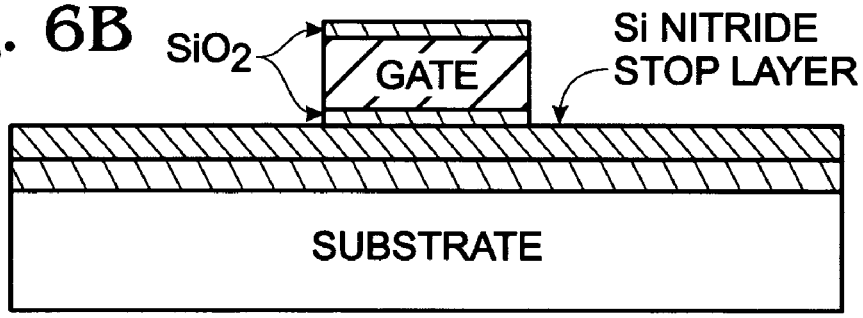

FIGS. 6A and 6B illustrate the process flows for two alternate substrate insulation layer processes. Note, the subsequent process drawings show a single layer substrate insulation layer. However, it should be understood that either type of substrate insulation can be used. FIG. 6A shows the V-TFT structure cross-section after a gate etch for single layer SiO2 substrate insulation layer. The amount of overetch is controlled by etch time only. FIG. 6B shows the V-TFT structure cross-section after a gate etch for a three-layer substrate insulation stack. The final step of the poly gate plasma etch removes oxide with high selectivity to nitride. Thus, the oxide step remaining after the gate etch is determined by the as-deposited thickness of the oxide layer.

Figure 7:
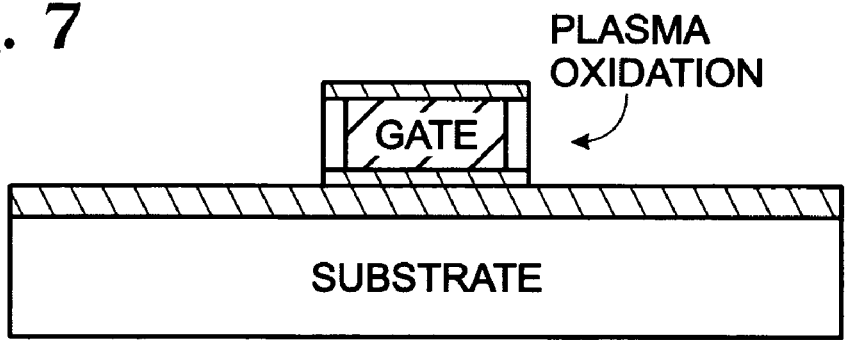
FIG. 7 is a partial cross-sectional view of the V-TFT transistor of FIG. 6a, following plasma oxidation.

The exemplary V-TFT process continues as follows:
Clean the gate surface to remove polymer and contamination resulting from the plasma etch, using a sequence of RCA clean and HF.
Form the gate insulation layer (tox) with a thickness between 25 and 500 Å. Many possible methods can be used including:
PECVD SiO2 deposition, especially TEOS oxide; or,
PECVD or LPCVD silicon nitride.
FIG. 7 is a partial cross-sectional view of the V-TFT transistor of FIG. 6a, following plasma oxidation. For example, an inductively coupled plasma (ICP) plasma oxidation of exposed polysilicon surfaces is performed. Note, this example assumes a Si gate material is used. As with conventional CMOS process gate oxides, the above-described gate oxide must provide good step coverage, low leakage current and high breakdown field, and a low density of interface states.

Figure 8:
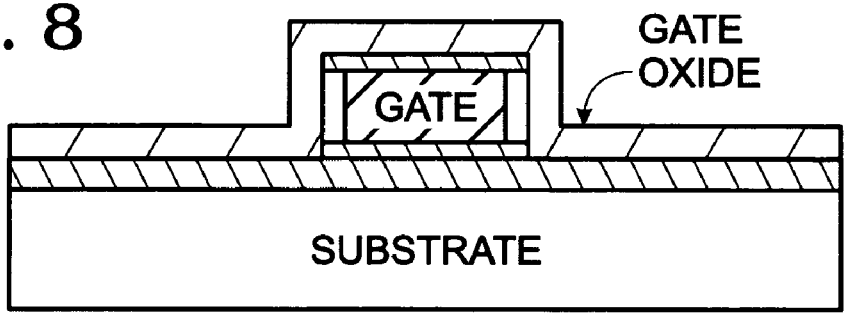
FIG. 8 is a partial cross-sectional view of the V-TFT transistor of FIG. 7 following a plasma-enhanced chemical vapor deposition (PECVD) TEOS deposition.

FIG. 8 is a partial cross-sectional view of the V-TFT transistor of FIG. 7 following a plasma-enhanced chemical vapor deposition (PECVD) TEOS deposition.
The exemplar V-TFT process continues as follows:
An amorphous silicon layer, 300 to 1000 Å thick, is deposited to form the transistor active channel.
Channel Vt adjust implant can be carried out at this time using an angled implant to ensure that dopant species are implanted in the back of the active channel.

Furnace anneal the structure to drive off the hydrogen in the amorphous silicon layer.

Laser-anneal the active silicon layer.

Different types of laser annealing can be used. In one aspect, the amorphous Si layer is exposed to excimer laser irradiation to transform it to polycrystalline silicon. The resulting poly-Si layer consists of medium-size, equiaxial grains, having a mean diameter in the order of 20-50 nm. Further advancements in the poly-Si microstructure can be realized by modifying the crystallization method. For example, the laser beam can be shaped prior to being directed to the surface of the substrate. The shaping of the laser beam can be accomplished using an assembly including a shaping mask and projection optics. This process yields a poly-Si microstructure consisting of long crystal domains separated by grain boundaries. The predicted periodicity of such crystals results in greater uniformity in the electrical characteristics of the resulting vertical-TFT.

Figure 13:
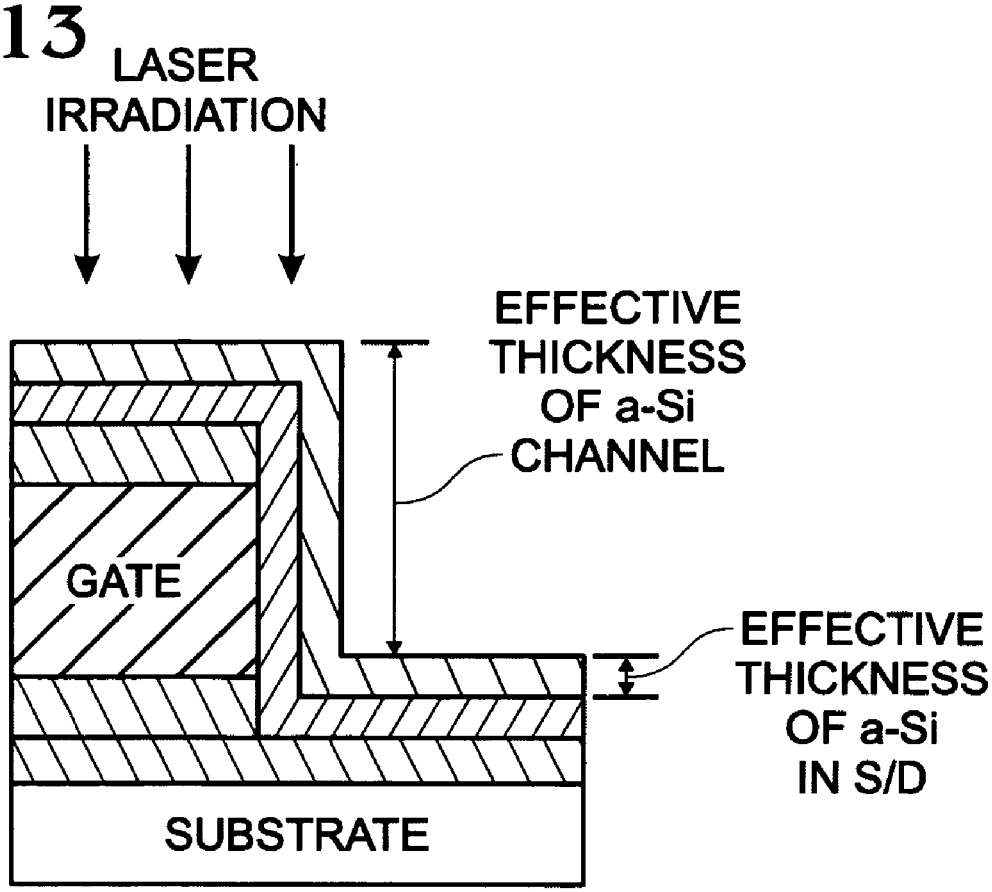
FIG. 13 is a partial cross-sectional view illustrating the laser irradiation process.

FIG. 13 is a partial cross-sectional view illustrating the laser irradiation process. One difficulty in implementing the previously described, lateral-crystallization process is the difference in temperature between the amorphous Si of the source/drain regions, and the channel region. For laser irradiation normal to the surface, a smaller volume of Si per unit surface area is heated in the source/drain regions, as compared to the volume of Si heated in the channel region. For a given laser fluence, the temperature of the source/drain regions is higher than the temperature of the channel region. Therefore, the relationship between the deposited amorphous Si thickness and gate thickness defines the process window for the crystallization step. It is desirable that the crystallization process be tuned to optimize the microstructure in the active layer region, without damaging the source/drain regions. The lower process limit is set by the minimum fluence that produces crystallization with high mobility in the channel region. The upper process limit is set by the maximum fluence that can be obtained without causing damage such as ablation or agglomeration in the source/drain regions.

To address the thickness disparity issue, a variation in the crystallization process can be performed. Lasers can be used to heat an additional absorption oxide layer overlying the Si, so that the Si film is only indirectly heated. Thus, the Si film melting threshold is lowered. The absorption layer may be exposed to the combined irradiation of excimer and CO2 laser beams. The CO2 beam preferentially heats the top SiO2 layer, thus, indirectly raising the temperature of the underlying Si film. By adjusting the thickness of the overlying SiO2 film, the excimer beam can be directed to the underlying Si film. The silicon film, already at high temperature due to the indirect heating, locally melts at a lower threshold temperature. Furthermore, capping the Si film with the SiO2 absorption layer prevents excessive evaporation, even if the temperature of the film reaches high levels.

Crystallization of the active silicon layer can also be carried out by nickel-assisted lateral crystallization, instead of laser irradiation. Nickel silicide acts as a source for the lateral crystallization of amorphous silicon during RTA annealing. In this variation, laser annealing need not be performed, and the time and temperature of the Ni silicide formation step is optimized so that the active channel is fully crystallized during the Ni silicide anneal by crystallization fronts from the source and drain regions meeting in the center of the active channel.

The exemplary V-TFT process continues as follows:
Deposit a SiO2 screening oxide layer 300 to 1000 Å thick.

Figure 9:
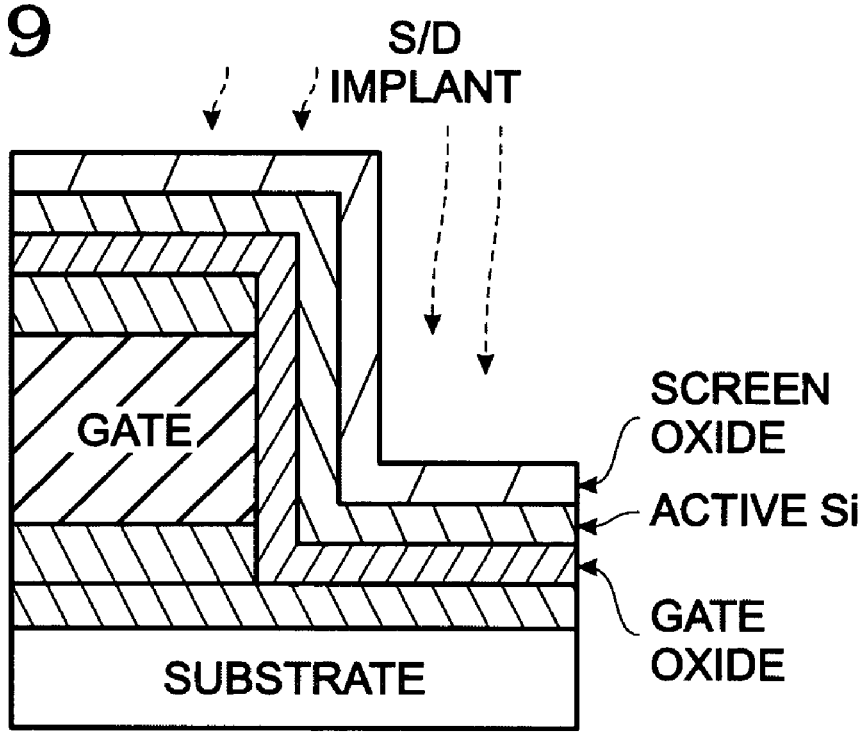
FIG. 9 is a partial cross-sectional view of the V-TFT of FIG. 8, illustrating source/drain implantation.

FIG. 9 is a partial cross-sectional view of the V-TFT of FIG. 8, illustrating source/drain implantation. Source and drain regions are implanted with the appropriate species using a tilt angle of 0 degrees. The implant energy is chosen to produce the appropriate doping of source drain regions without implanting too far down the active channel. The TEOS oxide layer acts as a spacer to block S/D implant from the back of the active channel (adjacent the second S/D region), while permitting implantation in the source and drain regions. Alternately stated, the spacer formed by the TEOS screening oxide layer prevents the doping of the back of the active channel by ions that are slightly off axis from 0 degrees.

Figure 10:
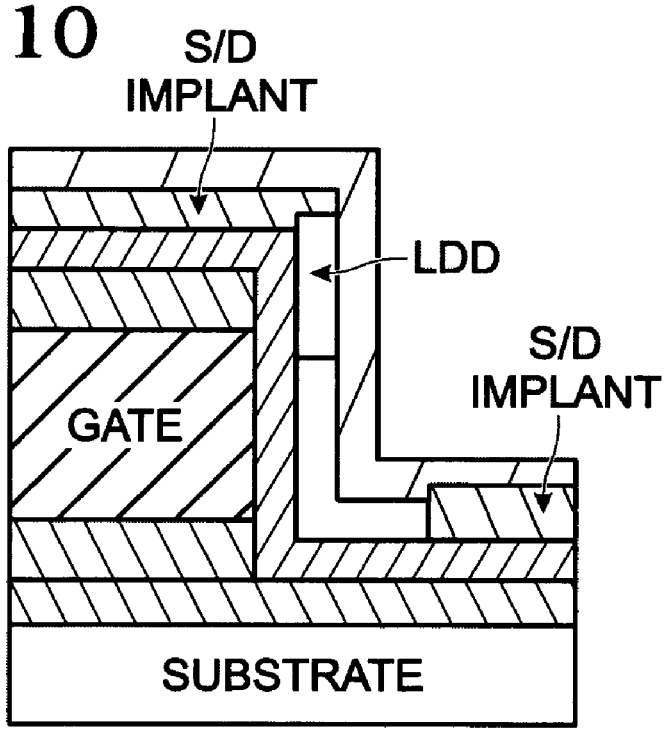
FIG. 10 is a partial cross-sectional view of the V-TFT of FIG. 9, illustrating an optional LDD process.

FIG. 10 is a partial cross-sectional view of the V-TFT of FIG. 9, illustrating an optional LDD process. Low dose LDD implants can be carried out, with a dose between about 5e12 and 5e13 ions/cm$^2$, and an energy greater than that of the S/D implant, so that the LDD is formed below the S/D region. Note that the LDD implant only affects the top of the channel region. As a result, high fields should not be applied to the source contact (second source/drain region, see FIG. 1) to prevent high gate-drain fields where there is no LDD implant at the lower gate edge.

Figure 11:
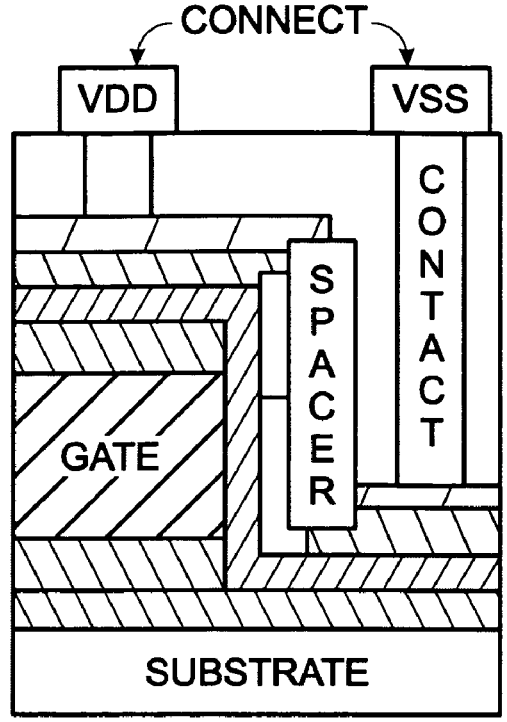
FIG. 11 is a partial cross-sectional view of the V-TFT of FIG. 10, illustrating the completed device.

FIG. 11 is a partial cross-sectional view of the V-TFT of FIG. 10, illustrating the LDD and S/D implant regions in greater detail.

The exemplary V-TFT process continues as follows:
Anneal the structure at about 600-700 degrees C., for 1 to 10 hours, to activate the dopants.
Etch to remove the screening oxide layer, stopping on silicon. If high value resistors are desired, the screening oxide etch can be masked using photolithography to leave some screening oxide over the active area silicon, to prevent silicide formation. These structures can be used as current limiting resistors in I/O circuits, and for analog voltage reference circuits.
Pattern the active silicon islands using photolithography and dry etch.
Etch the gate oxide. Optionally, high value poly resistors can be built by masking the gate oxide etch to leave gate oxide covering poly that is not to be silicided.
The active silicon and poly gate surfaces can be silicided using a self-aligned process at this point, but salicide is not required. Briefly, the salicide process is as follows:
Deposit a TEOS oxide spacer, 2000 to 5000 A thick.
Spacer etch.
Deposit metal (Ti, NI or Co) for silicide.
Anneal to form silicide.
Peroxide based wet etch to remove unreacted metal.
Anneal to stabilize the silicide.

FIG. 11 is a partial cross-sectional view of the V-TFT of FIG. 10, illustrating the completed device. A conventional back end process flow can be followed for isolation, contacts, and metal interconnections.

Key process requirements include:
1. The amorphous silicon step coverage must be good enough to provide a uniform layer thickness along the vertical face of the gate electrode.
2. Crystallization of the amorphous silicon forming the vertical channel is critical for high mobility.
3. The gate etch must be vertical, to prevent S/D and LDD implants on the vertical surface forming on the back of the active channel.
4. The LDD implant is only at the top channel region, so typically Vcc is applied to the top electrode (first source/drain region) to avoid short channel and hot carrier effects.

Key structure requirements include:

1. The channel length and transistor performance is determined by the thickness of the gate electrode.

2. The width of the gate structure must be sufficient to account for contact size and alignment tolerances. If contacts "fall off" the gate edge, they may short the transistor.

3. Active area/gate overlap determines the area of the drain region and Gate-Drain capacitance. Typically, the Gate-Drain capacitance is high, while Gate-Source capacitance is low. Some decrease of Gate-Drain capacitance can be accomplished by increasing the thickness of the top oxide buffer layer (the gate insulation layer). The upper limit of top oxide buffer thickness is determined by implant conditions.

4. The thickness of top (gate insulation) and bottom (substrate insulation) buffer oxide layers and implant energies are tuned to produce the desired Gate/Drain overlap. In particular, increasing the thickness of the top buffer layer increases the LDD width and decreases Gate-Drain capacitance.

Figure 12A:
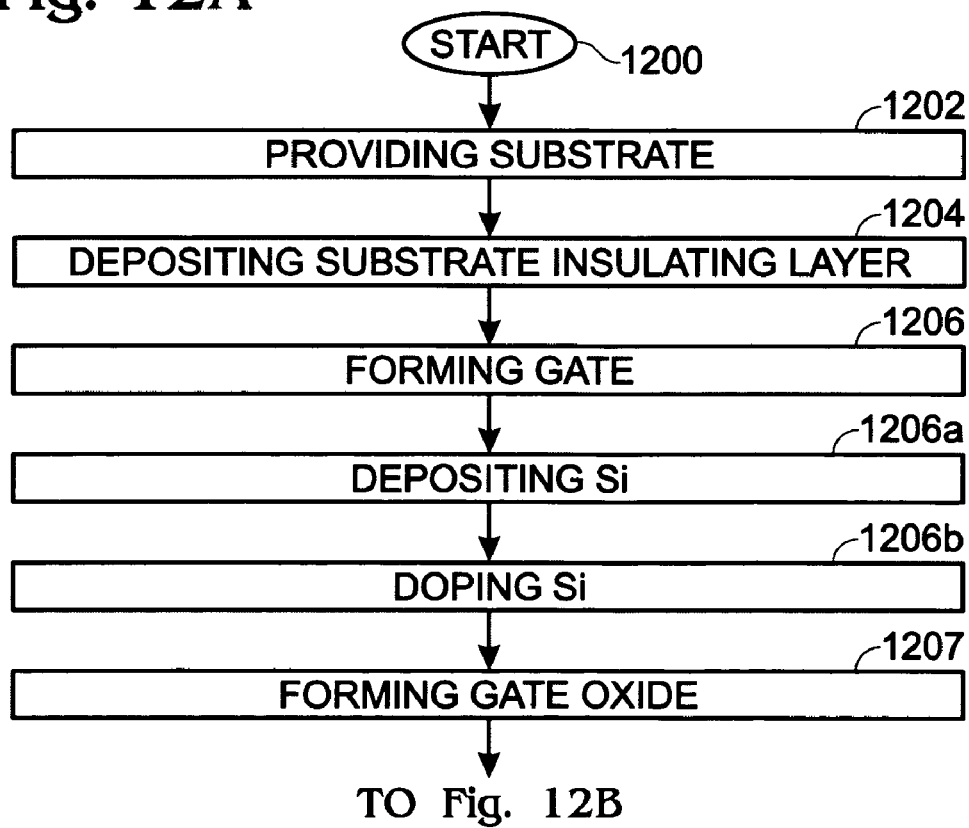
FIG. 12 is a flowchart illustrating the present invention method for forming a V-TFT.
Figure 12B:
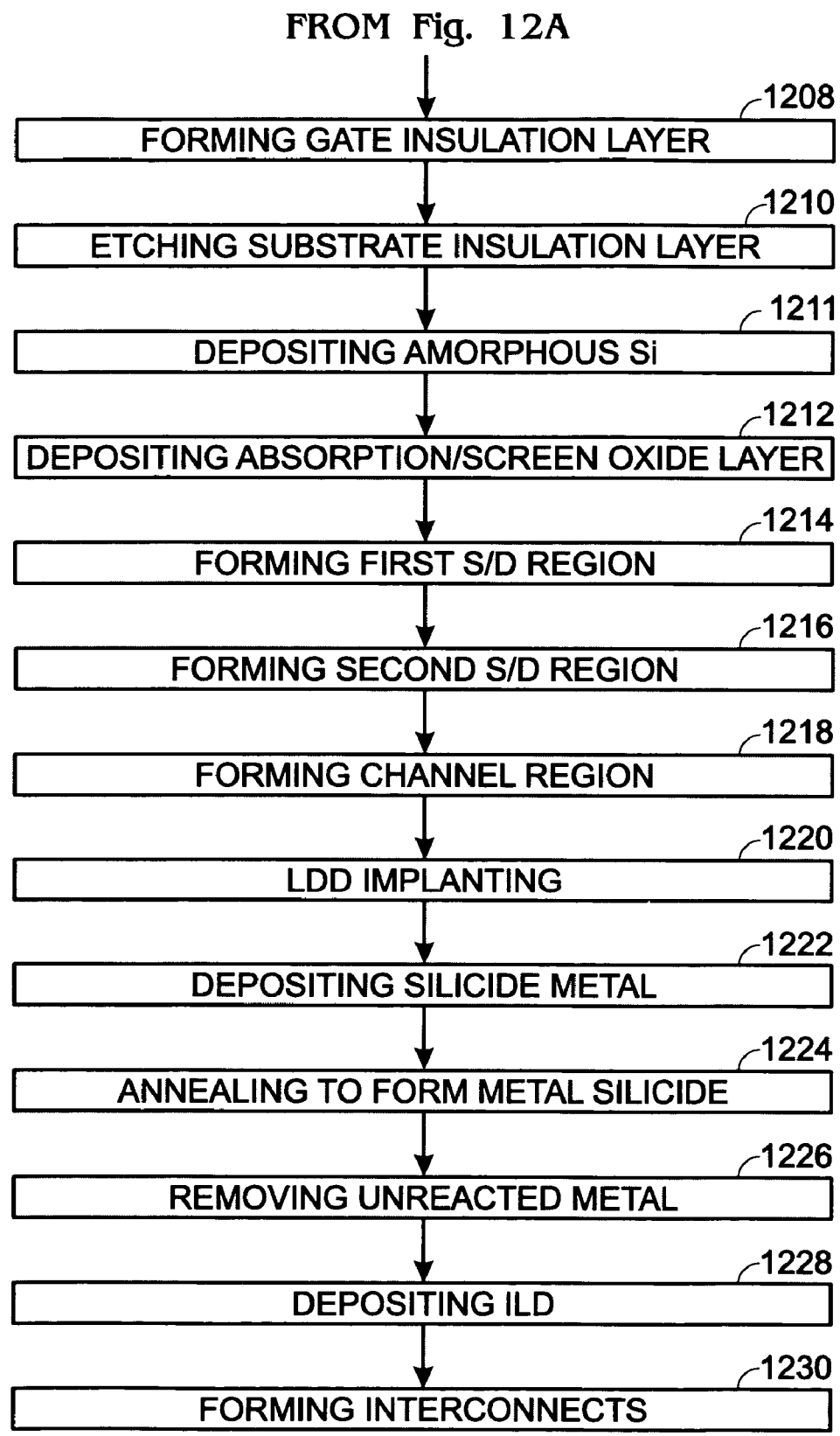

FIG. 12 is a flowchart illustrating the present invention method for forming a V-TFT. Although the method is depicted as a sequence of numbered steps for clarity, no order need necessarily inferred from the numbering. It should be understood that some of these steps may be skipped, performed in parallel, or performed without the requirement of maintaining a strict order of sequence. The method starts at Step 1200.

Step 1202 provides a substrate made from a material such as Si, quartz, glass, or plastic. Step 1204 conformally deposits an insulating layer overlying the substrate, made from a material such as $SiO_2$, $SiO_2/Si_3N_4/SiO_2$, or organic insulators such as polyimide. Step 1206 forms a gate, having sidewalls, a top surface, and a first thickness, overlying a substrate insulation layer. For example, the first thickness may be in the range of 1000 to 6000 Å. Step 1207 forms a gate oxide layer overlying the gate sidewalls. Step 1208 forms a gate insulation layer overlying the gate top surface. Step 1210, following the formation of the gate, etches the exposed substrate insulation layer. Then, following Step 1210, Step 1211 conformally deposits a silicon (Si) layer. For example, the amorphous Si layer may have a thickness in the range of 300 to 1000 Å.

Step 1214 forms a first source/drain region overlying the gate insulation layer. Step 1216 forms a second source/drain region overlying the substrate insulation layer, adjacent a first gate sidewall. Step 1218 forms a channel region overlying the first gate sidewall, interposed between the first and second source/drain regions. Alternately stated, the channel region is formed overlying the gate oxide layer formed in Step 1207. In some aspects a further step, Step 1220 forms an LDD in the channel region adjacent the first source/drain region.

Typically, the channel region has a channel length that is about equal to the gate first thickness. It is also typical that the first source/drain region (Step 1214), second source/drain region (Step 1216), and channel region (Step 1218) are formed from the Si layer conformally deposited in Step 1211.

In another aspect, forming a gate in Step 1206 includes forming a gate on a substrate insulation layer having a surface along a first plane. Etching the exposed substrate insulation layer in Step 1210 includes forming a recess in the substrate insulation layer, lower than the first plane. Then, forming a channel region overlying the first gate sidewall in Step 1218 includes extending the channel region into the substrate insulation layer recess.

The gate may be made from either a metal or Si material. If the gate material is Si, forming a gate in Step 1206 includes substeps. Step 1206a deposits a Si layer with the first thickness and sidewalls overlying the insulating layer. Step 1206b dopes the Si. Then, Step 1207 forms a gate oxide layer overlying the gate sidewalls by plasma oxidizing the gate Si layer sidewalls. In a different aspect, Step 1207 and 1208 may be performed sequentially. For example, the Step 1208 may be performed as soon as possible after Step 1207, after a tool change. In another aspect, forming a gate insulation layer overlying the gate top surface (Step 1208) includes forming a gate insulation layer from a material such as $SiO_2$ or $Si_3N_4$, having a thickness in the range of 25 to 500 Å.

In one aspect, Step 1213a (not shown) performs a Vt adjust implant in the channel region interposed between the first and second source/drain regions. In another aspect, Step 1213b (not shown) crystallizes the amorphous Si layer. For example, the amorphous Si may be crystallized by irradiation with an excimer laser. Alternately, Ni may be deposited overlying the amorphous Si layer, and annealed using a laser, furnace, or rapid thermal annealing (RTA) process. In another variation, Step 1212 deposits an absorption oxide layer overlying the amorphous Si layer, having a thickness in the range of 1000 Å to 1.5 microns. Then Step 1213b uses excimer and $CO_2$ lasers to irradiate the absorption oxide layer, to heat the underlying amorphous Si.

In a different aspect, Step 1212 deposits a screen oxide layer overlying the amorphous Si layer, having a thickness in the range of 300 to 1000 Å. The first and second source/drain regions are formed in Step 1214 and 1216, respectively, by performing source/drain implants through the screen oxide layer. Further, the LDD implant (Step 1220) may also be performed through the screen oxide layer.

In another aspect, Step 1222 deposits a silicide metal such as Ni, Ti, or Co, overlying the first and second source/drain regions. Step 1224 anneals to form a metal silicide. Step 1226 removes the unreacted metal. In one aspect, Step 1221 (not shown) anisotropically etches the screen oxide layer (Step 1212) to form a spacer that is useful in preventing the formation of silicide metals on or near the channel region.

Step 1228 conformally deposits an interlevel dielectric (ILD) overlying the transistor. Step 1230 forms metal interconnects through the ILD to the first source/drain region, the second source/drain region, and the gate.

In one aspect of the method, Step 1217 (not shown) forms a third source/drain region overlying the substrate insulation layer, adjacent a second gate sidewall. Then, Step 1219 (not shown) forms a channel region overlying the second gate sidewall, interposed between the first source/drain region and the third source/drain region adjacent the second gate sidewall.

A V-TFT and associated fabrication processes have been described. Examples of some specific structures, materials, and fabrication processes have been presented to illustrate the invention. However, the invention is not limited to merely these examples. Other variations and embodiments of the invention will occur to those skilled in the art.

We claim:

1. A vertical thin film transistor (V-TFT), the transistor comprising:
    a substrate;
    a substrate insulation layer overlying the substrate;
    a gate, having sidewalls and a top surface, overlying the substrate insulation layer;
    a gate insulation layer overlying the gate top surface;
    a first source/drain region overlying the gate insulation layer;

a second source/drain region overlying the substrate insulation layer, adjacent a first gate sidewall;

a channel region overlying the first gate sidewall, interposed between the first and second source/drain regions;

a Vt adjust implant in the channel region; and, wherein the first and second source/drain regions are crystallized Si having a thickness in the range of 300 to 1000 Å.

2. The transistor of claim 1 wherein the gate has a first thickness; and, wherein the channel region has a channel length about equal to the first thickness.

3. The transistor of claim 2 wherein the gate first thickness is in the range of 1000 to 6000 Å.

4. The transistor of claim 1 further comprising:

a lightly doped drain (LDD) in the channel region adjacent the first source/drain region.

5. The transistor of claim 1 wherein the substrate is a material selected from group including Si, quartz, glass, and plastic; and, wherein the substrate insulation layer is a material selected from the group including $SiO_2$, $SiO_2/Si_3N_4/SiO_2$, and organic insulators such as polyimide.

6. The transistor of claim 1 wherein the substrate insulation layer includes a recess formed in the substrate insulation layer adjacent the first gate sidewall; and, wherein the channel region extends into the substrate insulation layer recess.

7. The transistor of claim 1 wherein the gate is a doped Si material.

8. The transistor of claim 7 further comprising:

oxidized Si gate sidewall insulators; and, wherein the gate insulation layer is a material selected from the group including $SiO_2$ and $Si_3N_4$, having a thickness in the range of 25 to 500 Å.

9. The transistor of claim 1 wherein the gate is a metal material selected from the group including W and TiN.

10. The transistor of claim 1 wherein the first and second source/drain regions include Ni impurities.

11. The transistor of claim 1 further comprising:

an oxide spacer overlying the channels region, interposed between the first and second source/drain regions.

12. The transistor of claim 1 further comprising:

silicide metal regions, selected from the group of materials including Ni, Ti, and Co, formed in the first and second source/drain regions.

13. The transistor of claim 1 further comprising:

an interlevel dielectric (ILD) overlying the transistor; and, interconnects through the ILD to the first source/drain region, the second source/drain region, and the gate.

14. The transistor of claim 1 further comprising:

a third source/drain region overlying the substrate insulation layer, adjacent a second gate sidewall; and, a channel region overlying the second gate sidewall, interposed between the first source/drain region and the third source/drain region adjacent the second gate sidewall.

* * * * *